United States Patent [19]

Katsumata et al.

[11] Patent Number: 4,782,030

[45] Date of Patent: Nov. 1, 1988

[54] METHOD OF MANUFACTURING BIPOLAR SEMICONDUCTOR DEVICE

[75] Inventors: Yasuhiro Katsumata, Fujisawa, Japan; Takao Ito, Ithaca, N.Y.

[73] Assignee: Kabushiki Kaisha Toshiba, Kawasaki, Japan

[21] Appl. No.: 70,830

[22] Filed: Jul. 7, 1987

[30] Foreign Application Priority Data

Jul. 9, 1986 [JP] Japan ............................. 61-161618
Nov. 14, 1986 [JP] Japan ............................. 61-271208

[51] Int. Cl.$^4$ ..................................... H01L 21/306
[52] U.S. Cl. ..................................... 437/33; 437/31; 437/228; 437/186; 437/200; 148/DIG. 10; 148/DIG. 11; 357/34; 357/59; 156/653
[58] Field of Search ............... 437/31, 32, 33, 162, 437/186, 191, 193, 200, 225, 228, 233, 238; 156/643, 653, 657; 357/59 H, 34; 148/DIG. 10, DIG. 11

[56] References Cited

U.S. PATENT DOCUMENTS

| | | | |
|---|---|---|---|
| 4,234,362 | 11/1980 | Riseman | 148/187 |
| 4,309,812 | 1/1982 | Horng et al. | 437/31 |
| 4,338,138 | 7/1982 | Cavaliere et al. | 437/31 |
| 4,481,706 | 11/1984 | Roche | 437/33 |
| 4,590,666 | 5/1986 | Gato | 437/33 |
| 4,693,782 | 9/1987 | Kikuchi et al. | 156/657 |

FOREIGN PATENT DOCUMENTS

55-26630 7/1980 Japan .

OTHER PUBLICATIONS

Ghandhi, "VLSI Fabrication Principles" 1983, pp. 352-355.
Chai, A New Self Aligned . . . " IEDM Tech. Dig. 1985, pp. 26-29.

*Primary Examiner*—Brian E. Hearn
*Assistant Examiner*—Kevin McAndrews
*Attorney, Agent, or Firm*—Finnegan, Henderson Farabow, Garrett and Dunner

[57] ABSTRACT

A laminated film made of a first insulating film and a second insulating film having a selectivity of etching condition to the first insulating film is selectively formed on a first conductivity type semiconductor substrate to use the substrate under the laminated film as a base and emitter active region forming region. The laminated film remains until an anisotropically dry etching step is finished to prevent the base and emitter active region from damaging due to an etching atmosphere at anisotropically dry etching time.

6 Claims, 11 Drawing Sheets

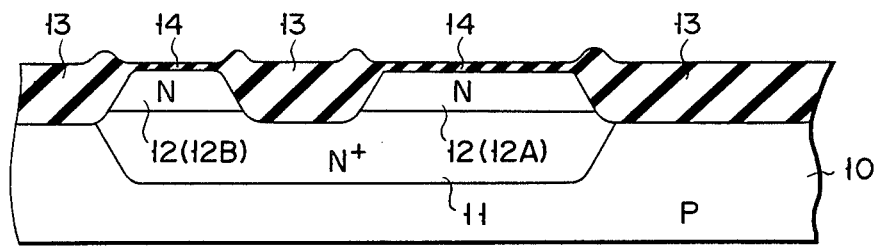
F I G. 4A
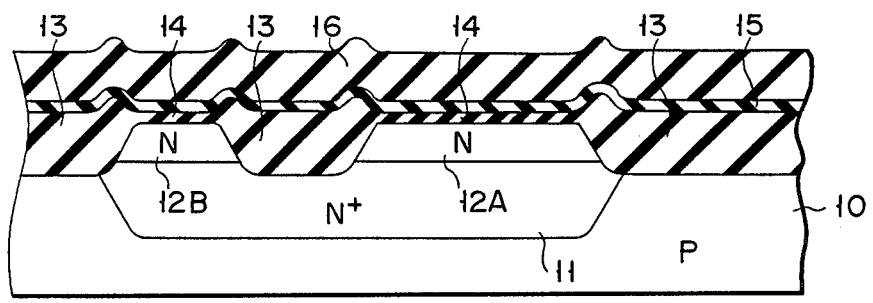
F I G. 4B
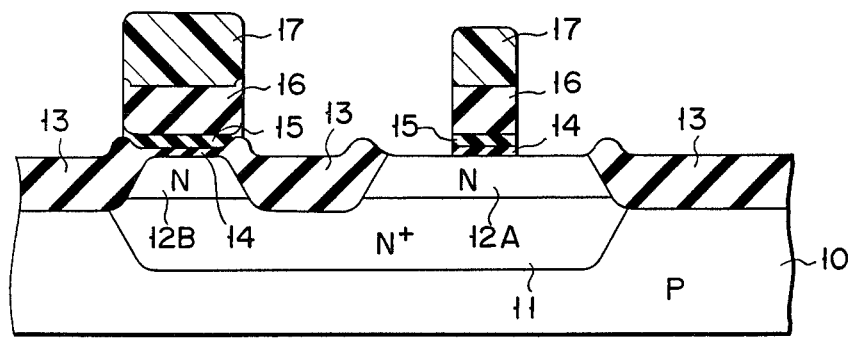
F I G. 4C

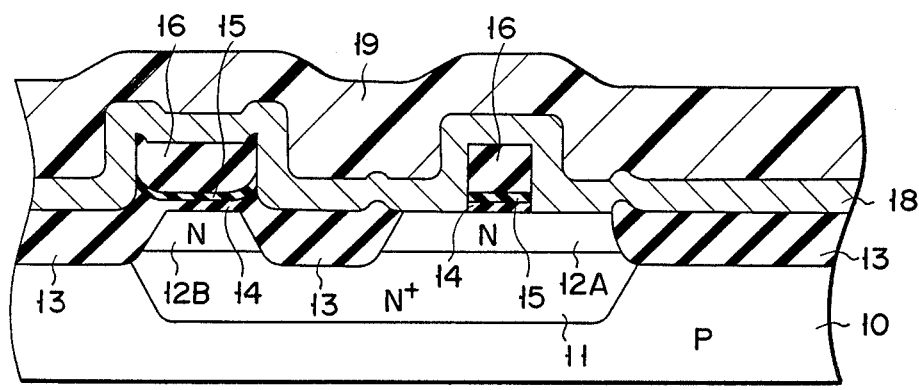
F I G. 4D
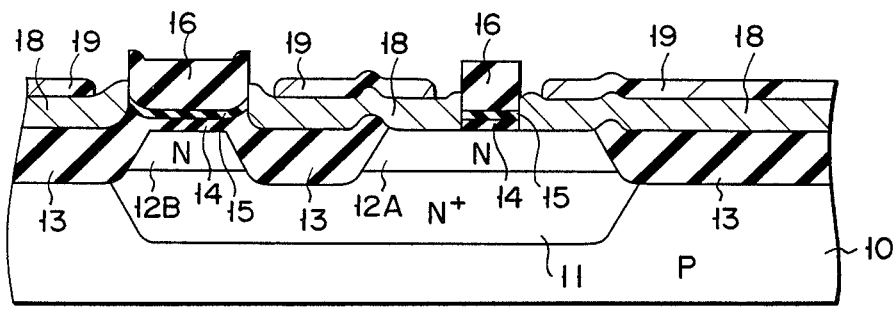
F I G. 4E
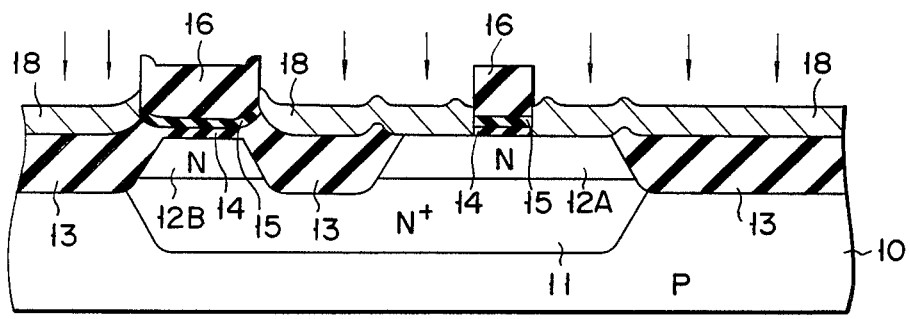
F I G. 4F

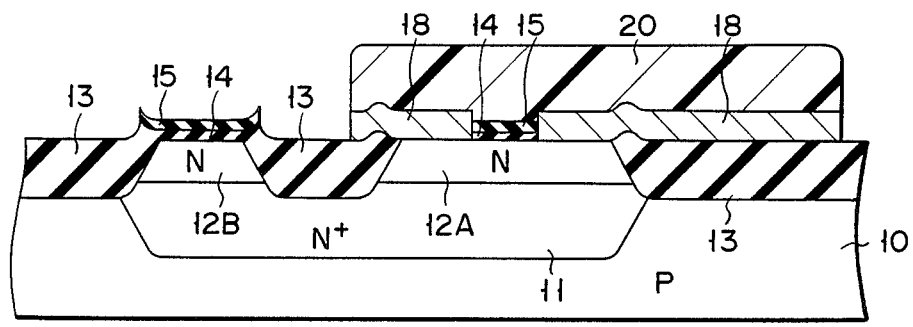
F I G. 4G
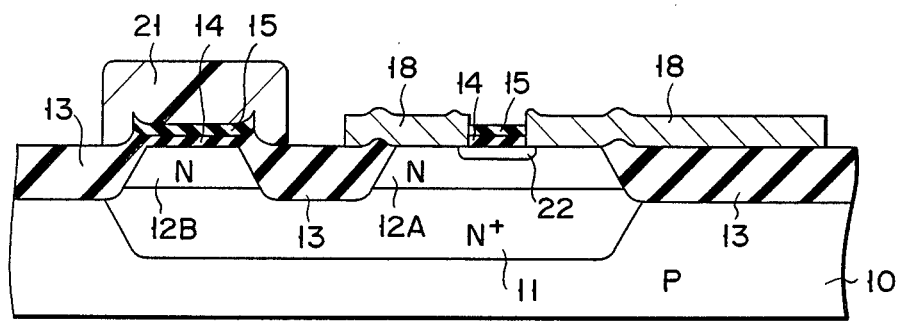
F I G. 4H
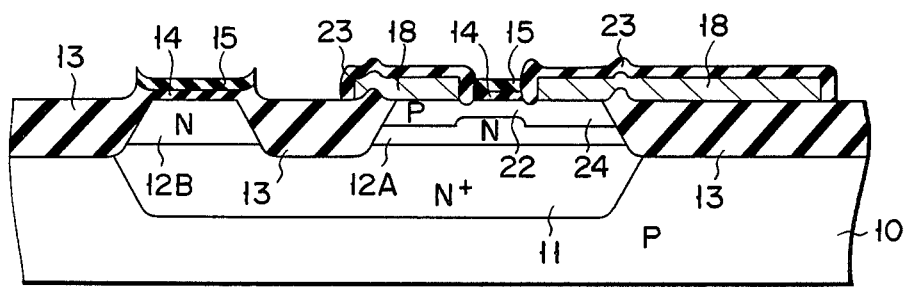
F I G. 4I

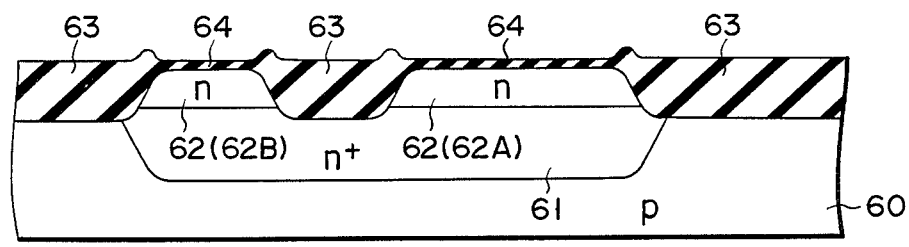
F I G. 9A
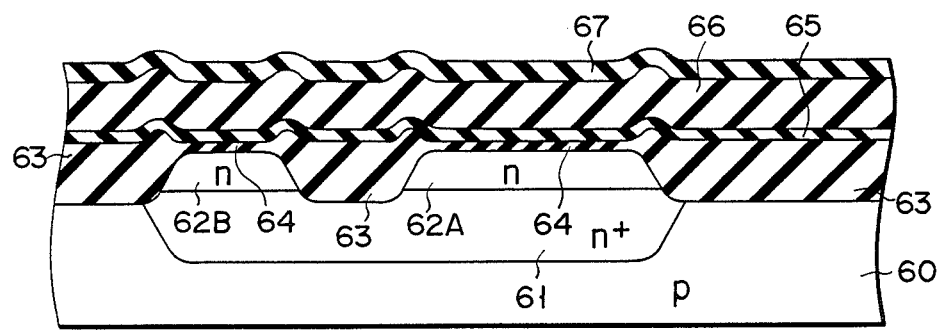
F I G. 9B
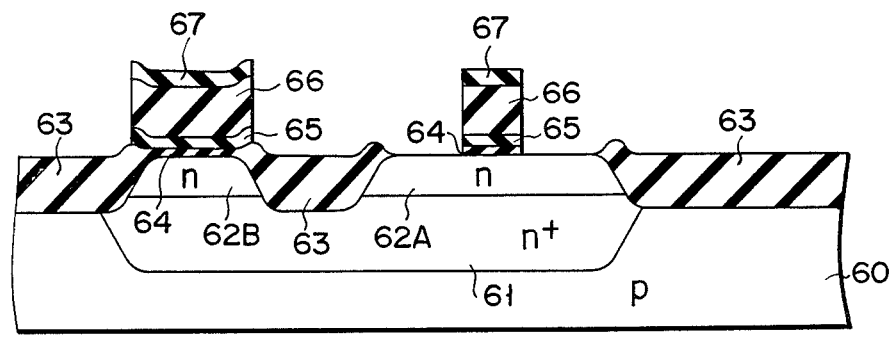
F I G. 9C

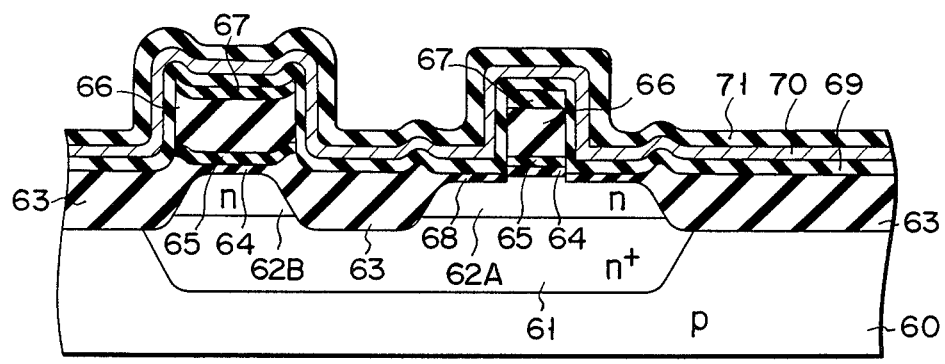
F I G. 9D
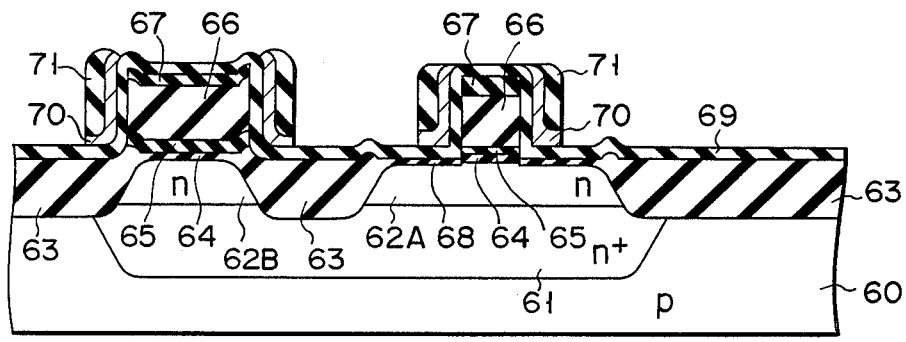
F I G. 9E
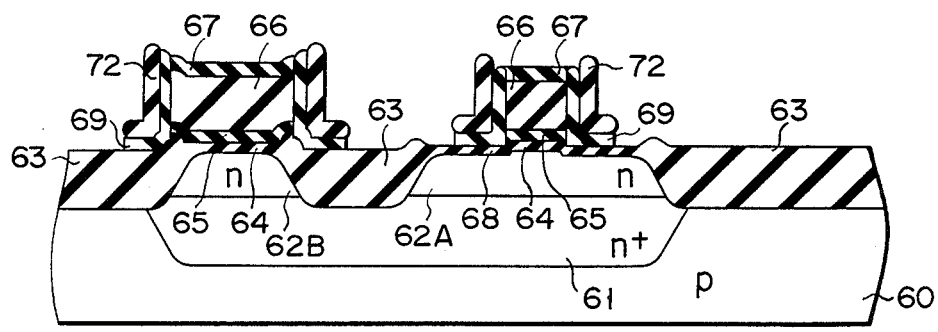
F I G. 9F

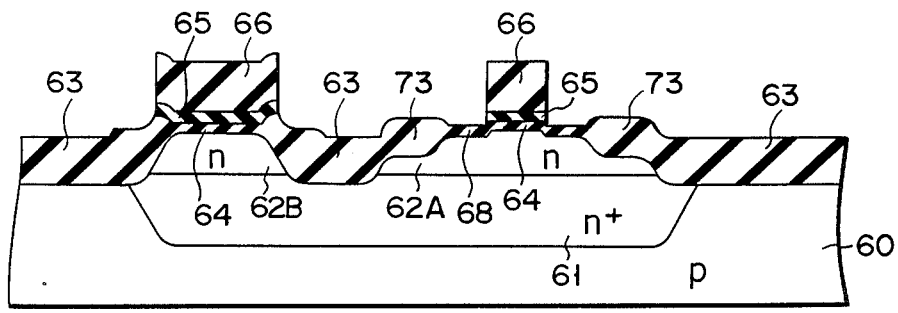
F I G. 9G
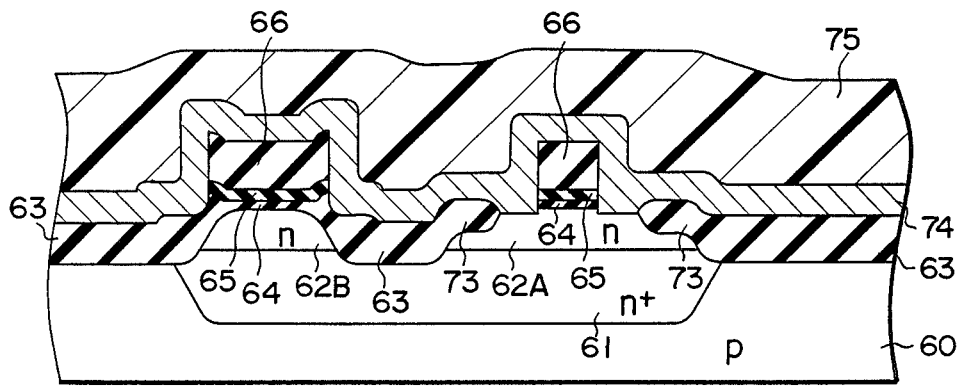
F I G. 9H
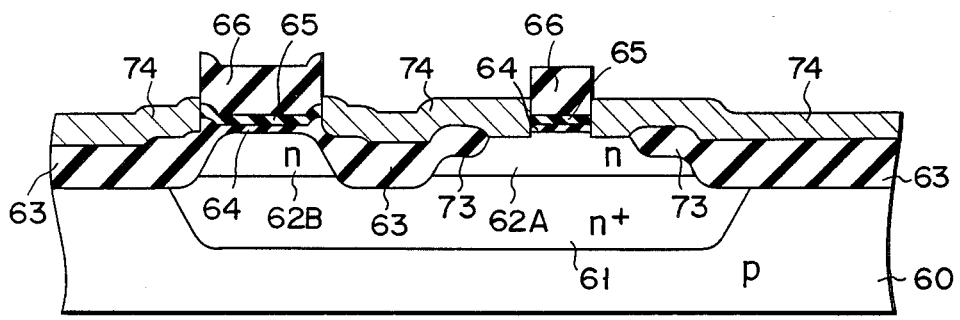
F I G. 9I

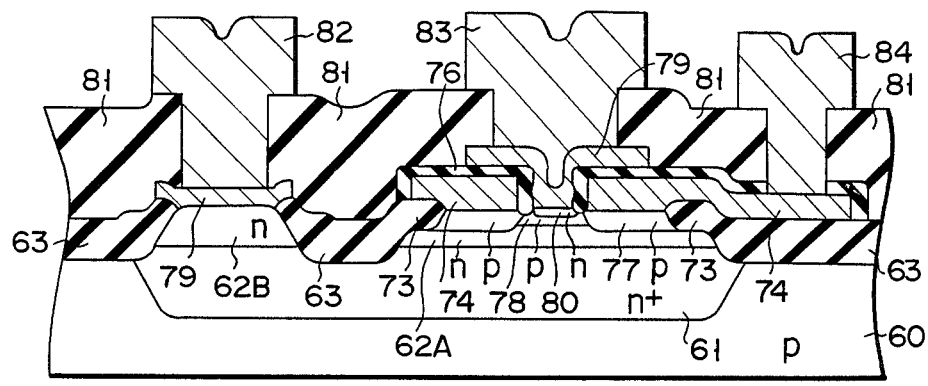
F I G. 9M
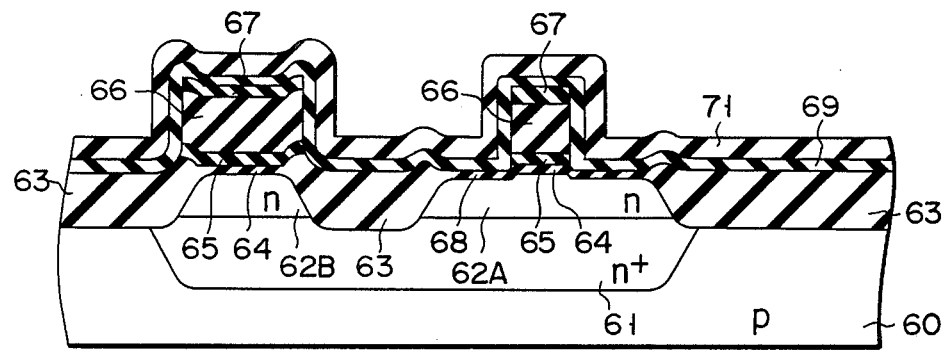
F I G. 10A
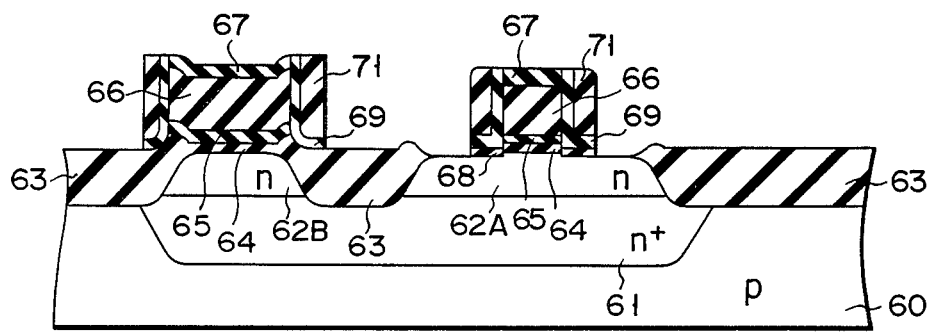
F I G. 10B

METHOD OF MANUFACTURING BIPOLAR SEMICONDUCTOR DEVICE

BACKGROUND OF THE INVENTION

This invention relates to a method of manufacturing a bipolar semiconductor device for a high speed logic operating circuit or for an analog operating circuit in a high frequency range.

The performance of a bipolar transistor adapted for a high speed logic operation or an analog operation in a high frequency range has been improved by various means, such as forming a shallow junction in a vertical direction, separating elements by a buried oxide film or a trench structure to reduce a parasitic capacity between a substrate and a collector, and decreasing a parasitic capacity between a base and a collector and between the base and an emitter as well as a base resistance by fine lithographic technique and self-alignment technique.

More particularly, a transistor used before employing the above-mentioned means is constructed as shown in a sectional view of FIG. 1. This transistor is of npn type. P type base diffusion region 1 is formed in an n type substrate or n type epitaxial layer N type emitter diffusion region 2 is further formed in base diffusion region 1. Base electrode 3 and emitter electrode 4 made of metal are formed to contact with base diffusion region 1 and emitter diffusion region 2, respectively.

In order to improve the high frequency characteristic of a bipolar transistor, it is necessary to reduce a parasitic resistance and a parasitic capacitance and, particularly to, reduce base resistance rbb' and collector-base junction capacity Cjc. In a transistor of conventional structure shown in FIG. 1, rbb' is determined according to distance L1 from the contacting position of base electrode 3 to emitter diffusion region 2, and can be reduced when distance L1 is decreased. However, the limit of reduction in distance L1 is determined according to the margin in alignment of electrodes 3 and 4 with contact holes and to distance L2 determined by the design rule in photolithographic step for the electrode metal. Junction capacity Cjc decreases when width L3 of base diffusion region 2 is reduced, however this limit is determined according to the design rule in lithographic step for the electrode metal. Thus, the conventional structure shown in FIG. 1 cannot effectively reduce base resistance rbb' and collector-base junction capacity Cjc.

Japanese Patent Publication No. 41826/1982 official gazette discloses an invention to eliminate the abovedescribed drawback. A transistor of the invention disclosed in the official gazette employs a base leading electrode structure with a polycrystalline silicon layer, and shown in sectional view in FIG. 2. The transistor is of npn type. P type base diffusion region 1 is formed in an n type substrate or an n type epitaxial layer. N type emitter diffusion region 2 is formed in base diffusion region 1. Emitter electrode 3 made of metal is formed to contact directly emitter diffusion region 2, and base diffusion region 1 is connected via p+ type polycrystalline silicon film 5 to base electrode 4. With such a structure, it is not necessary to extend base diffusion region 1 to the lower portion of base electrode 4, thereby reducing width L4 of base dlffueion region 1. Thus, collector-base junction capacity Cjc can be reduced to a certain degree. In this structure, base resistance rbb' is determined according to distance L5 from the contact of polycrystalline silicon film 5 with base diffusion region 1 to emitter diffusion region 2, and rbb' can be reduced to a certain degree.

However, contact position of polycrystalline silicon film 5 with base diffusion region 1 and distance L5 from the contact position to a opening for used in diffusing an impurity to emitter diffusion region 2 are not determined in self-alignment manner, and collector-base junction capacity Cjc and base resistance rbb' cannot be sufficiently reduced.

U.S. Pat. No. 4,284,362 is heretofore known as an example of reducing base resistance rbb' by forming a base electrode leading polycrystalline silicon layer and a window for used in diffusing an impurity in an emitter diffusion region in a self-alignment manner. In a method for manufacturing a transistor according to this patented invention, as shown in sectional view in FIG. 3, base leading electrode forming polycrystalline silicon layer 6 and first insulating film 7 are sequentially formed on a single crystal silicon substrate made of P− type layer, N+ type layer, N type layer and P type layer. Opening 8 is formed on emitter and base active regions, second insulating film 9 is grown on the structure. Second insulating film 9 is selectively removed by anisotropically dry etching to allow second insulating film 9 to remain only on the side walls of first insulating film 7 and base leading electrode polycrystalline silicon layer 6. The position of the emitter diffusion region and the position of base leading electrode forming polycrystalline silicon layer 6 are determined in a self-alignment manner by means of second insulating film 9 remaining on the side walls. Thus, the emitter diffusion region and the polycrystalline silicon layer 6 are positioned in the minimum distance therebetween, thereby reducing the base resistance.

However, when removing second insulating film 9 by anisotropically dry etching, the surface of primary single crystal silicon substrate is exposed with plasma atmosphere of chlorine gas used, thereby causing the emitter diffusion region formed in the later step to be damaged. Moreover, a difficulty arises in providing selectivity under anisotropically dry etching between the polycrystalline silicon layer and the emitter diffusion region made of single crystal silicon. Another difficulty arises in detection of the completion of the etching, and it lacks mass productivity.

The anisotropically dry etching technique is advantageous in that it provides semiconductor devices with a high working accuracy. Thus, the dry etching technique is necessarily indispensable in the method of this type.

As described above, the conventional technique has various drawbacks, such as damages to the active region done by anisotropically dry etching, reduction of the production yield, low mass-productivity, and insufficient the base resistance.

SUMMARY OF THE INVENTION

An object of this invention is to provide a method of manufacturing a semiconductor device which prevents a damage of an active region by anisotropically dry etching, reduces a base resistance sufficiently, presents a high manufacturing yield, and is suitable for high mass productivity.

According to an aspect of the present invention, there is provided a method of manufacturing a semiconductor device comprising the steps of:

forming on a first conductivity type semiconductor substrate a laminated film made of a first insulating film and a second insulating film having a selectivity of etching condition to the first insulating film, forming a non-single crystal silicon film on the structure including said laminated film, removing the non-single crystal silicon film on the laminated film, doping a second conductivity type impurity into the remaining non-single crystal silicon film, removing said second insulating film, doping an impurity of said second conductivity type into the substrate to form a first diffusion region, thermally oxidizing said remaining non-single crystal silicon film to form a second conductivity type second diffusion region in that portion of said substrate which is under the non-single crystal silicon film and to form a third insulating film on said non-single crystal silicon film, and forming a first conductivity type third diffusion region in said first diffusion region.

According to another aspect of the present invention, there is provided a method of manufacturing a semiconductor device comprising the steps of:

forming on a first conductivity type semiconductor substrate a laminated film made of a first insulating film and a second insulating film having a selectivity of etching condition to the first insulating film, forming a non-single crystal silicon film on the structure including said laminated film removing the non-single crystal silicon film on the laminated film, doping a second conductivity type impurity into the remaining non-single crystal silicon film, removing said second insulating film, doping an impurity of said second conductivity type into the substrate via said first insulating film to form a first diffusion region, thermally oxidizing said remaining non-single crystal silicon film to form a second conductivity type second diffusion region in that portion of said substrate which is under the non-single crystal silicon film and to form a third insulating film on said non-single crystal silicon film, and forming a first conductivity type third diffusion region in said first diffusion region.

According to these methods of manufacturing the semiconductor device of this invention, the laminated film made of the first insulating film and the second insulating film having a selectivity of etching condition to the first insulating film is selectively formed on the first conductivity type semiconductor substrate to use the substrate under the laminated film as a base and emitter active region forming region. The laminated film remains until the anisotropically dry etching step is finished to prevent the base and emitter active region from damaging due to the etching atmosphere at anisotropically dry etching time.

Further, the base leading electrode non-single crystal silicon film is formed on the structure having the laminated film, only the non-single crystal silicon film on the laminated film is thereafter removed, the second conductivity type impurity is doped into the non-single crystal silicon film, the second insulating film is removed, the second conductivity type impurity is doped via the first insulating film into the substrate to form the first diffused region and then the non-single crystal silicon film is thermally heated to form the second conductivity type second diffusion region on the substrate under the non-single crystal silicon film and to simultaneously form the third insulating film on the surface of the non-single crystal silicon film, thereby insulating the base leading electrode made of the non-single crystal silicon film and forming the opening for the emitter region in a self-alignment manner.

According to a further aspect of the present invention, there is provided a method of manufacturing a semiconductor device comprising the steps of:

forming a high impurity concentration second conductivity type first single crystal silicon semiconductor region on a first conductivity type single crystal silicon substrate, forming a low impurity concentration second conductivity type second single crystal silicon semiconductor region on said first single crystal silicon semiconductor substrate, separating said second single crystal silicon semiconductor region by an insulating layer to form a base and emitter region and a collector contacting region, forming, on said collector contacting region, a first laminate film made of a first insulating film and a second insulating film having a selectivity of etching condition to said first insulating film and, simultaneously forming, on a predetermined position of the base and emitter region, a second laminated film made of a first insulating film and a second insulating film having a selectivity of etching condition to said first insulating film, forming a first non-single crystal silicon film on the structure having the first and second laminated films, removing first non-single crystal silicon films on said first and second laminated films, doping a first conductivity type impurity into said first non-single crystal silicon film, removing said second insulating films of said first and second laminated films, removing said first non-single crystal silicon film on a region except said base and emitter region including said second laminated film, doping an impurity of said first conductivity type into said base and emitter region via said first insulating film of the second laminated film to form an internal base region, themally oxidizing said first non-single crystal silicon film to diffuse said first conductivity type impurity doped in said the first non-single crystal silicon film into said base and emitter region to form an external base region and to form a third insulating film on the surface of said first non-single crystal silicon film thereby forming a base leading electrode made of the first non-single crystal silicon film and contacted with the said external base region, removing said first insulating films of the first and second laminated films to expose the surfaces of said collector contacting region and the internal base region, forming a second non-single crystal silicon film on said collector contacting region and the exposed internal base region, and diffusing an impurity of said second conductivity type into said internal base region via said second non-single crystal silicon film to form an emitter region.

According to a still further aspect of the present invention, three is provided a method of manufacturing a semiconductor device comprising the steps of:

forming on a first conductivity type semiconductor substrate, a first insulating layer comprising a first oxidation resistant insulating film, a second insulating film formed on said first oxidation resistant insulating film and having a selectivity of an etching condition to said first insulating film, and a third oxidation resistant insulating film formed on said second insulating layer, forming a fourth oxidation resistant insulating film on the structure having said first insulating layer, selectively etching said fourth insulating film so that part of the fourth insulating film remains on the side wall of said first insulating layer, selectively oxidizing the surface of the semiconductor region, using the remaining fourth insulating film as a mask to form a buried oxide layer, removing the remaining fourth and third insulating films, exposing the surface of said semiconductor region between said first insulating layer and said buried oxide layer, forming a first non-single crystal semiconductor film on the structure having said first insulating layer, selectively removing said first non-single crystal semiconductor film on said second insulating film, doping a second conductivity type impurity to said first non-single crystal semiconductor film, removing said second insulating film, thermally heating the surface of said first non-single crystal semiconductor film to form a thermal oxide film and to diffuse the impurity in said first non-single crystal semiconductor film into said semiconductor region to form a second conductivity type first semiconductor layer, removing said first insulating film, doping the second conductivity type impurity into the surface of said semiconductor region adjacent to the first semiconductor layer, using said thermal oxide film as a mask, to form a second semiconductor layer, and forming a first conductivity type third semiconductor layer on the surface of said second semiconductor layer.

According to the method of the fourth aspect of the invention, the first insulating layer made of the first silicon oxide film, the first silicon nitride film, the second silicon oxide film and the second silicon nitride film is formed on the semiconductor region, and the first insulating layer is etched except the portion forming an active base region in the later step to expose the substrate. The third silicon oxide film is formed on the exposed substrate, the third silicon nitride film, the first polycrystalline silicon film and the fourth silicon oxide film are then sequentially formed, the fourth silicon oxide film is etched by an anisotropically etching method so that the fourth film remains only on the side wall of the first insulating film, and the first polycrystalline silicon film is etched, using the fourth silicon oxide film as a mask. The fourth silicon oxide film is removed, the first polycrystalline silicon film is then oxidized to form the fifth silicon oxide film, the third silicon nitride film is etched, using the fifth silicon oxide film as a mask, the fifth silicon oxide film is removed, and a selective oxidation is performed, using the third silicon nitride film as a mask.

The position of the external base region can be determined in a self-alignment manner at the region outside from the first insulating layer, in unit of approx. 0.1 micron, by the above-described steps.

Using the second silicon oxide film and the first silicon nitride film as masks, the third silicon oxide film is removed. Thereafter, the base leading second polycrystalline silicon film is formed on the structure, and the second polycrystalline silicon film is further coated with a photoresist. Since the first insulating film is higher by its thickness than the surface of the semiconductor region, the photoresist film is thinly formed on the first insulating film. When the photoresist film is entirely etched by anisotropically etching method, the photoresist film and the second polycrystalline silicon film are first etched and removed on the first insulating layer on which the photoresist film is thin, and the second polycrystalline silicon film can remain on the region except the first insulating layer. Since the active base region and the emitter region are protected on the surfaces by the first insulating layer, the regions are not damaged by anisotropically etching. The anisotropical etching must be finished when the photoresist film and the second polycrystalline silicon film on the first insulating layer are removed. To this end, the etching may be finished when the first insulating layer is exposed, and the end of etching can be readily recognized. Then, the second silicon oxide film is removed. Using the first silicon nitride film as a mask, the second polycrystalline silicon film is selectively oxidized so that the insulation of the base leading electrode made of the second polycrystalline silicon film is insulated in self-alignment manner and the size of the emitter opening is determined also in self-alignment manner.

BRIEF DESCRIPTION OF THE DRAWINGS

FIGS. 4A to 4K are sectional views showing semiconductor structures in the steps of a method of manufacturing a semiconductor device, according to one embodiment of the present invention;

FIGS. 9A to 9M are sectional views showing a semiconductor device in the eteps of a method of manufacturing the device, according to still further embodiments of the invention; and FIGS. 10A and 10B are sectional views showing a semiconductor device in the steps of a method of manufacturing the device, according to still another embodiments of the invention.

DETAILED DESCRIPTION OF THE PREFERRED EMBODIMENTS

Figure 1:
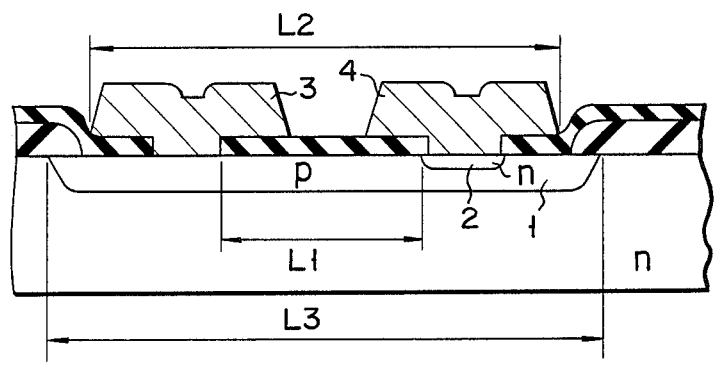
FIG. 1 is a sectional view showing a conventional semiconductor device.
Figure 2:
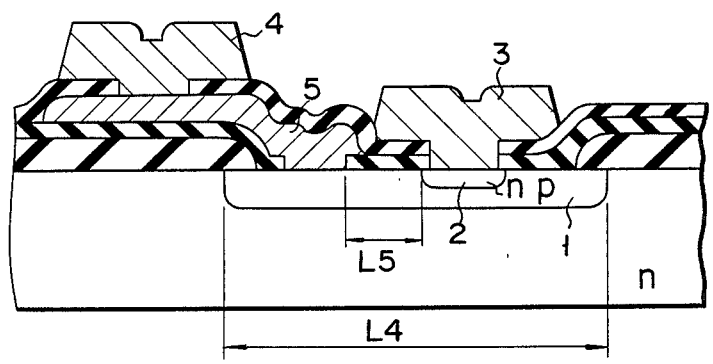
FIG. 2 is a sectional view showing another conventional semiconductor device.
Figure 3:
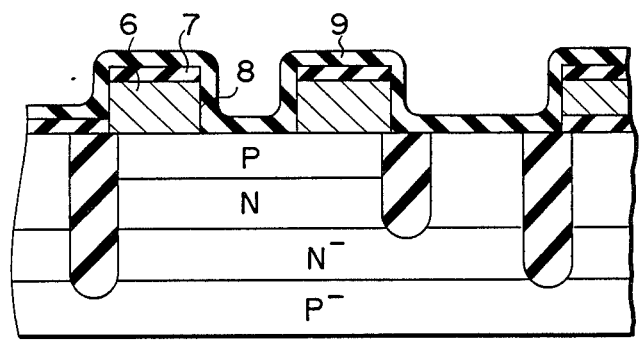
FIG. 3 is a sectional view showing still another conventional semiconductor device.

FIGS. 4A to 4K are sectional views showing the semiconductor structures in the steps of a method of manufacturing a semiconductor device, in which the present invention is applied to a bipolar npn transistor

PROCESS 1 (FIG. 4A)

As shown in FIG. 4A, N+ type single crystal silicon semiconductor layer 11 is formed on P type single crystal silicon semiconductor substrate 10. Semiconductor layer 11 is generally called "N+ type buried layer" and reduces a collector parasitic resistance. Semiconductor layer 11 may be formed by doping an n type impurity such as antimony or arsenic to substrate 10 by a thermal diffusion method or an ion implantation method. Semiconductor layer 11 is selectively formed by lithographic technique at a position where an npn transistor is formed in later steps. Then, N type epitaxial layer 12 is grown, for example, approximately 1 to 2 microns on substrate 10 and semiconductor layer 11 by an epitaxially growth method. Subsequently, element forming regions are separated by means of, for example, a pn junction, a selective oxidation, a buried oxidation, or a trench oxidation. This embodiment will be described by utilizing the buried oxidation. Buried oxide film 13 is formed in a region except the element forming region of substrate 10 and in epitaxial layer 12 so that the element forming region is separated from other element forming region, and base and emitter regions 12A and collector contacting region 12B are separated. A photoresist film of a predetermined pattern is formed by lithographic technique and an n type impurity is implanted into collector contacting region 12B by impurity implanting technique, using the photoresist film as a mask, so that a collector parasitic resistance is reduced. The implanting of the impurity into collector contacting region 12B may be performed by a thermal diffusion or an ion implantation of the impurity before separating the element forming regions, or by a thermal diffusion or an ion implantation of the impurity after the elements are separated. Then, a native silicon oxide film (not shown) on the structure is removed by an etching method to expose the surfaces of base and emitter region 12A made of epitaxial layer 12 and collector contacting region 12B, and silicon oxide film (SiO$_2$ film) 14 is grown on the structure, for example, approximately 500 Angstroms thick by a thermal oxidation method.

The implanting of the n type impurity into collector contacting region 12B may be performed, after silicon oxide film 14 is grown, by forming a photoresist film of a predetermined pattern by lithographic method and then implanting ions of the n type impurity into collector contacting region 12B, using the photoresist film as a mask.

PROCESS 2 (FIG. 4B)

As shown in FIG. 4B, a silicon nitride film (SiN film) 15 is then grown, for example, approximately 800 to 1000 Angstroms thick by a pressure-reduced chemical vapor deposition method (Pressure-reduced CVD). Further, silicon oxide film 16 is grown, for example, approximately 5000 to 7000 Angstroms on silicon nitride film 15 by pressure-reduced CVD or a normal atmospheric pressure CVD. Silicon nitride film 15 and silicon oxide film 16 may be grown by a plaema CVD.

PROCESS 3 (FIG. 4C)

As shown in FIG. 4C, photoresist film 17 is formed on the structure, and then selectively etched by lithographic technique, remaining the photoresist film on a part (emitter region) of base and emitter region 12A and on entire collector contacting region 12B. With photoresist film 17 as a mask, silicon oxide film 16, silicon nitride film 15 and silicon oxide film 14 are selectively and sequentially etched by an anisotropically dry etching method (e.g., RIE, i.e., reactive ion etching method) using gas such as CF$_4$. The etching is executed until the surface of base and emitter region 12A made of epitaxial layer is exposed.

PROCESS 4 (FIG. 4D)

As shown in FIG. 4D, photoresist film 17 is then removed, polycrystalline silicon layer 18 is then grown as a non-single crystal silicon layer, for example, approximately 4000 to 5000 Angstroms thick by a pressure-reduced CVD, and is coated again with photoresist film 19. As shown, photoresist films 19 are formed thinly on base and emitter region 12A and collector contacting region 12B as compared with other portion.

PROCESS 5 (FIG. 4E)

When photoresist film 19 is then anisotropically dry etched by gas such as chlorine series, polycrystalline silicon layer 18 under the thin portion of resist film 19 is early etched and removed as shown in FIG. 4E to expose silicon oxide film 16, and polycrystalline silicon layer 18 remains on the other region.

PROCESS 6 (FIG. 4F)

The remaining resist film 19 is then incinerated in an oxygen plasma or treated and removed with aqueous sulfuric acid solution. Thereafter, as shown in FIG. 4F, a p type impurity ion such as boron ion is implanted, for example, under the condition of 50 keV of accelerating electric field and approximately $2 \times 10^{15}/cm^2$ of dosage to polycrystalline silicon layer 18. Instead, a p type impurity may be used as a dopant when polycrystalline silicon layer 18 is grown in the steps in FIG. 4D, so that the p type impurity is implanted into polycrystalline silicon layer 18 simultaneously when polycrystalline silicon layer 18 is grown.

PROCESS 7 (FIG. 4G)

Thereafter, silicon oxide film 16 is removed with fluoric acid solution, and photoresist film 20 of a predetermined pattern attained by lithographic technique is so formed as to cover the base and emitter region 12A as shoWn in FIG. 4G. With resist film 20 as a mask, polycrystalline silicon layer 18 is selectively etched and removed.

PROCESS 8 (FIG. 4H)

Then, as shown in FIG. 4H, collector contacting region 12B is masked with photoresist film 21, and a p type impurity ion such as boron ion is implanted under the condition of, for example, 40 keV of accelerating electric field and $2 \times 10^{14}/cm^2$ of dosage. The impurity ion thus implanted passes through silicon nitride film 15 remaining on base and emitter region 12A and silicon oxide film 14 under the film 15 to arrive at base and emitter region 12A. As a result, p type internal base region (active base region) 22 is formed in base and emltter region 12A.

PROCESS 9 (FIG. 4I)

Subsequently, as shown in FIG. 4I, photoresist film 21 is removed. Thereafter, with silicon nitride film 15 as a mask, polycrystalline silicon layer 18 is thermally oxidized, so that silicon oxide film 23 is grown, for example, approximately 2000 to 3000 Angstroms thick on the surface region of silicon layer 18. As shown, in the thermal heating, a p type impurity doped in advance in polycrystalline silicon layer 18 is diffused to form external base region (P$^+$ type base region) 24. Simultaneously, the ions implanted in advance in internal base region 22 are diffused to increase internal base region 22. Further, in the thermal heating of polycrystalline silicon layer 18, not only the exposed surface but also the side wall of polycrystalline silicon layer 18 adjacent to the side wall of silicon nitride film 15 are oxidized to insulate the base leading electrode made of polycrystalline silicon layer 18 and separate the base leading electrode from the emitter region to be formed in later steps. If silicon nitride film 15 is thick, the side wall of polycrystalline silicon layer 18 is not sufficiently oxidized in the thermal heating thereof and consequently insufficiently separated. If silicon nitride film 16 is exceseively thin, a number of pinholes exist in silicon nitride film 15. Thus, when polycrystalline silicon layer 18 is oxidized, the surface of the region forming an emitter region (internal base region 11) is oxidized. Therefore, it is neceesary for silicon nitride film 15 to be set in thickness so as not to cause the above-mentioned difficulty, and the thickness is preferably, for example, in a range of 800 to 1000 Angstroms.

PROCESS 10 (FIG. 4J)

Figure 4J:
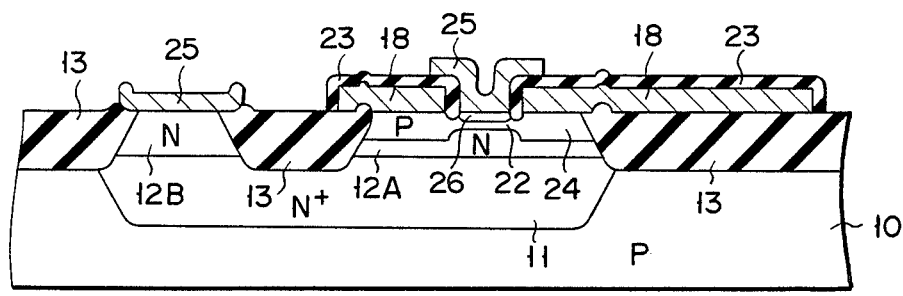

As shown in FIG. 4J, silicon nitride film 15 is removed, for example, by an isotropic dry etching method using mixture gas plasma of $CF_4$ and $O_2$, and silicon oxide film 14 is then removed with fluoric acid solution. Here, since silicon oxide film 23 formed on surface of polycrystalline silicon film 18 is thick, for example, 2000 to 3000 Angstroms, only silicon oxide films 14 on collector contacting region 12B and internal base region 22 are completely removed to expose the surfaces of collector contacting region 12B and internal base region 22, while remaining silicon oxide film 23. Since the wet etching using the fluoric acid solution is an isotropic etching, the side wall of silicon oxide film 24 for separating the base leading electrode made of polycrystalline silicon layer 18 from internal base region 22 forming the emitter region might be etched to increase the size of the emitter region. In order to prevent this, silicon oxide film 14 may be removed by an anisotropically dry etching method using gas such as $CF_4$. Gas plasma such as $CF_4$ causes sufficiently small damage to the single-crystal silicon film as compared with chlorine gas plasma used in the etching of the polycrystalline silicon film. Moreover, gas plasma of $CF_4$ can provide a selectivity, i.e., exclusiveness to etch the silicon oxide film and the single-crystal silicon film. In other words, an etching condition under which the silicon oxide film is etched, while the single-crystal silicon film is not etched, and another etching condition under which the single-crystal silicon film is etched, while the silicon oxide film is not etched, can be determined. Thus, the surface is not damaged in the etching step for exposing the surface of internal base region 22 to affect no influence to the thermal diffusion step to be executed later. Then, polycrystalline silicon layer 25 is grown by pressure-reduced CVD, and an n type impurity ion such as arsenic is doped by means of an ion implanting method to polycrystalline silicon layer 25. Instead, when polycrystalline silicon layer 25 is grown, an n type impurity such as arsenic may be doped into the polycrystalline silicon layer. Polycrystalline silicon layer 25 remains only on collector contacting region 12B and internal base region 22 by lithographic technique and, thereafter, the n type impurity is diffused from polycrystalline silicon layer 25 containing the n type impurity to form emitter region 26 in internal base region 22.

PROCESS 11 (FIG. 4K)

Figure 4K:
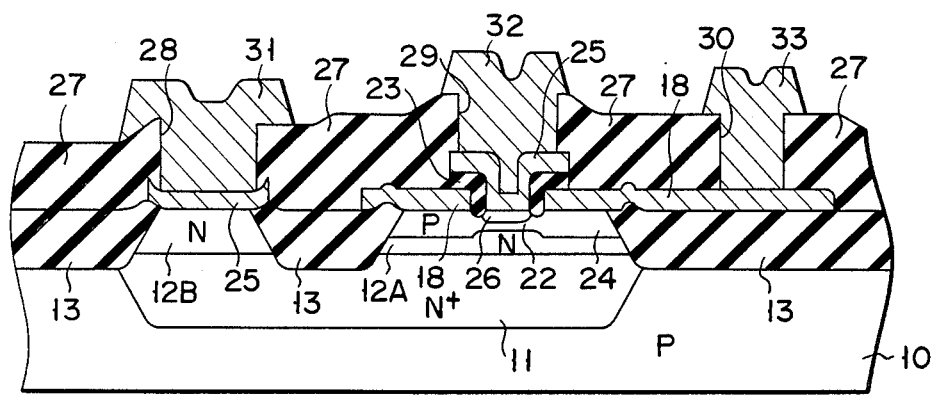

Thereafter, as shown in FIG. 4K, using polycrystalline silicon layer 25 as a mask, silicon oxide film 23 on polycrystalline silicon layer forming a base leading electrode 18 is removed with fluoric acid solution. Then, interlayer insulating film 27 such as silicon oxide film is grown by OVD, and contacting holes 28, 29, 30 exposing the surfaces of polycrystalline silicon layer 25 and polycrystalline silicon layer 18 are formed in interlayer insulating film 27 by lithographic technique. Further, the film made of metal such as aluminum, aluminum-silicon alloy, or aluminum-silicon-copper alloy is formed thereon. The metal film is selectively etched by lithographic technique so that those portions of the metal film remain, which are on contacting holes 28, 29, 30 and which form collector electrode 31, emitter electrode 32 and base electrode 33, respectively. Thereafter, the structure is coated with a surface protective film, not shown, to complete an npn transistor In the method of the embodiment described above, since silicon nitride film 15 is formed on the active region forming emitter region 26 at the anisotropically dry etching with chlorine gas plasma which damages the single crystal silicone layer, the surface of the active region is not exposed with the plasma atmosphere of anisotropically dry etching. Thus, the surface of the active region is not damaged, and the thermally oxidation step later performed is affected by no influence. Therefore, the transistor can be reduced in size by utilizing high dimensional accuracy of the anisotropically dry etching method.

Since the side wall of polycrystalline silicon layer 18 adjacent to the side wall of silicon nitride film 15 is oxidized to insulate the base leading electrode formed of polycrystalline silicon layer 18 and to separate the base leading electrode from emitter region 27 to be formed later, base leading electrode 18 and emitter region 27 can be separated in minimum size of the thickness of silicon oxide film 23 in a self-alignment manner. Since any special step is not contained, the production yield can be improved and high productivity can be obtained.

The present invention is not limited to the particular embodiments described above. Various other changes and modifications may be made within the spirit and scope of the present invention. For example, in the method of the embodiments described above, silicon oxide film 23 formed on polycrystalline silicon layer 18 is removed before interlayer insulating film 27 is formed. This is because, when contacting holes 28, 29, 30 for collector, emitter and base electrodes 31, 32, 38, respectively, are formed, the thickness of insulating film 27 is substantially the same at the positions of the electrodes. If the thickness of film 27 is not substantially the same, the side wall of thin insulating film 27 is etched.

Figure 5:
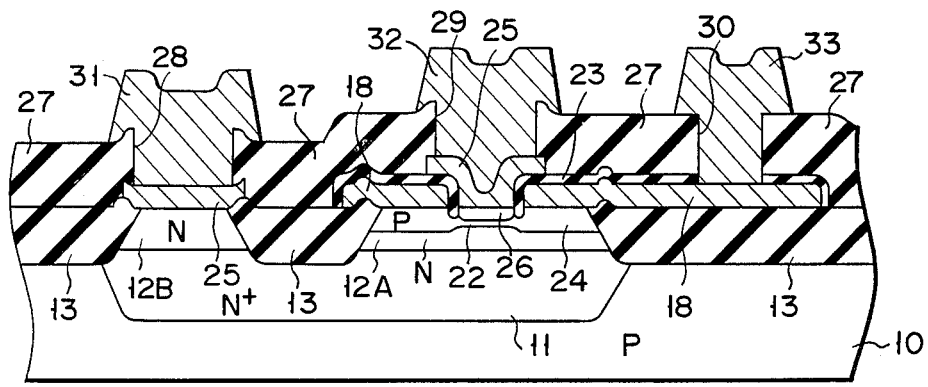
FIG. 5 is a sectional view showing a semiconductor device obtained by a method of manufacturing the device, according to another embodiment of the present invention.

However, when the anisotropically dry etching method is used and insulating film 27 and silicon oxide film 23 are selectively etched under different etching conditions, silicon oxide film 23 may be remained, and the contacting holes may be formed. FIG. 5 is a sectional view showing the final structure of an npn transistor manufactured through the step as such. In FIG. 5, the same reference numerals as in the first embodiment in FIGS. 4A to 4K denote the same parts in the second embodiment, and the detailed description thereof will be omitted.

In the method of the embodiments in FIGS. 4A to 4K and FIG. 5, the separation of an element forming region from other element forming regions and the separation of the collector region from the base and emitter region are executed by buried oxidation. However, these separations may be performed by the provision of the pn junction or the trench resistor type as described above.

Figure 6:
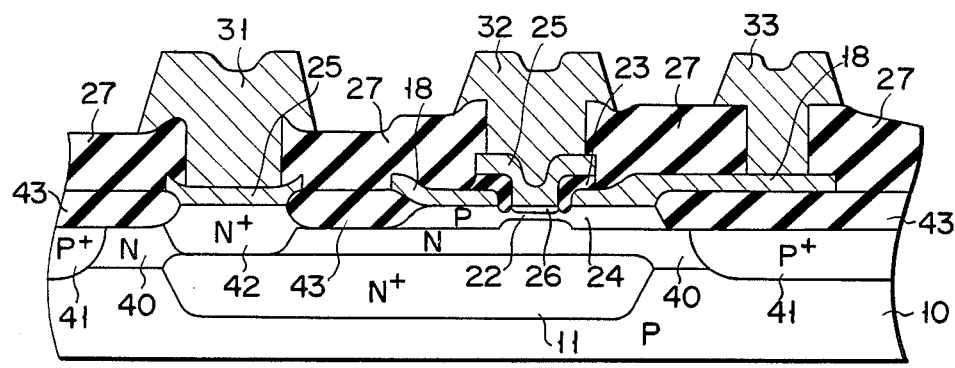
FIGS. 6, 7 and 8 are sectional views showing semiconductor devices obtained by a method of manufacturing the device, according to yet another embodiments of the invention.

FIG. 6 is a sectional view showing the final structure according to the method of the case employing the separation by the pn junction instead of the buried oxidation to separate the element forming regions. In the method according to this embodiment, high impurity concentration N+ type semiconductor layer 11 is formed in P type substrate 10, and epitaxial layer 40 is then grown on substrate 10. Then, P type diffusion region 41 is formed in epitaxial layer 40 by a thermal diffusion method or an ion implantation method to separate element forming regions. Thereafter, N+ type region 42 for reducing a collector parasitic resistance is so formed in epitaxial layer 40 as to arrive at N+ type semiconductor layer 11 by diffusing an impurity ion, and silicon oxide film 43 is then formed by a selectively oxidization method to separate element forming regions and to separate N+ type region 42 from base and emitter region (composed of regions 22, 24, 26). The later steps are the same as the case of the embodiment in FIGS. 4A to 4K. The same reference numerals as in the first embodiment in FIGS. 4A to 4K denote the same parts in this embodiment, and the detailed description thereof will be omitted.

Figure 7:
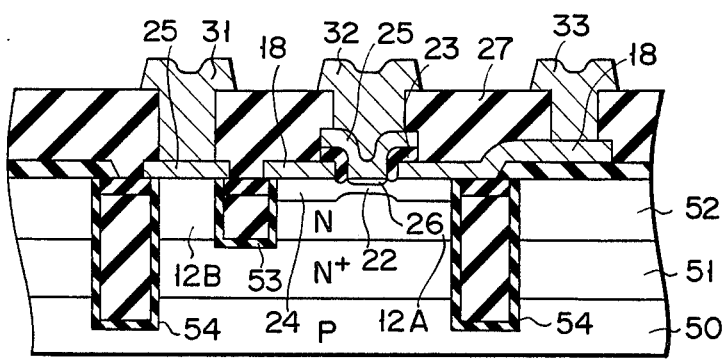

FIG. 7 is a sectional view showing the final structure according to the method in which, instead of the buried oxidation, a shallow trench resistor and a deep trench resistor are employed to separate element forming regions. According to the method of this embodiment, high impurity concentration N+ type semiconductor layer 51 is formed on P type substrate 50, and low impurity concentration N type epitaxial layer 52 is then formed on semiconductor layer 51, a separating region 53 constituted by a shallow trench resistor is formed to separate collector contacting region 12B from base and emitter region 12A, and a separating region 54 constituted by a deep trench resistor is formed to arrive at its bottom in substrate 50 to separate an element forming region from other element forming regions. An n type impurity is implanted in high concentration to collector contacting region 12B so as to reduce collector parasitic resistance. The later steps are similar to the case of the embodiment in FIGS. 4A to 4K, the same reference numerals as in the first embodiment in FIGS. 4A to 4K denote the same parts in this embodiment, and the detailed description thereof will be omitted.

Figure 8:
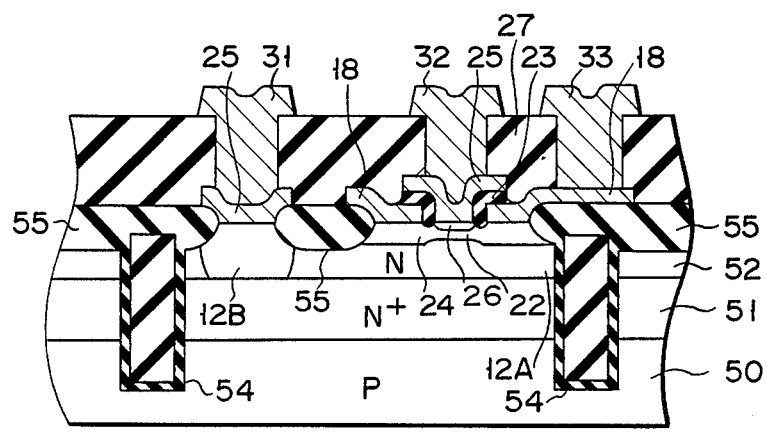

FIG. 8 is a sectional view showing the final structure according to the method of a further embodiment, in which, instead of buried oxidation, a deep trench resistor and a selective oxidation film are employed to separate element forming regions. In this method, as in the embodiment of FIG. 7, high impurity concentration N+ type semiconductor layer 51 is formed on P type substrate 50 and low impurity concentration N type epitaxial layer 52 is formed on semiconductor layer 51, and then separating region 54 constituted by deep trench resistor is formed to arrive at its bottom in substrate 50 to separate an element forming region from other element forming regions. Then, silicon oxide film 55 is formed by a selectively oxidation method to separate collector contacting region 12B from base and emitter region 12A. The steps performed following the oxidation of silicon oxide film 65 are similar to those in the embodiment in FIGS. 4A to 4K, the same reference numerals as in the first embodiment in FIGS. 4A to 4K denote the same parts in this embodiment, and the detailed description thereof will be omitted.

According to the embodiments described above, the size of the transistor can be reduced by utilizing high etching-dimensional accuracy of the anisotropically dry etching method without damaging the surface of the active region. Further, since the insulation of the base leading electrode and the separation of the base leading electrode from emitter region 26 to be formed later are executed by forming silicon oxide film 23, the base leading electrode and emitter region 26 are separated in the minimum size of the thickness of silicon oxide film 23 in a self-alignment manner to largely reduce the base resistance and to reduces the size of the elements.

In the embodiments described above, the base leading electrode is formed of polycrystalline silicon layer 18. However, this invention is not limited to the particular embodiments. For example, as this is generally called "polyside", the base leading electrode may be formed of 2-layer structure of a lower layer of polycrystalline silicon layer and an upper layer made of compound of silicon and a high melting point metal such as molybdenum, titanium or tungsten. Polycrystalline silicon layer 18 is used as a non-single crystal silicon layer. Non-single crystal silicon layer includes a layer made of an amorphous silicon.

FIGS. 9A to 9M are sectional views of the structures in the steps performed in the manufacturing method according to a further embodiment of the invention. In this embodiment, the present invention is applied to an npn bipolar transistor.

PROCESS 1 (FIG. 9A)

N+ type layer 61 is formed in p type silicon semiconductor substrate 60. N+ type layer 61 is called "n+ type buried layer" and reduces the parasitic resistance of a collector. N+ type layer 61 may be formed by doping an n type impurity such as antimony or arsenic to substrate 60 by a thermal diffusion method or an ion implantation method. N+ type layer 61 is selectively formed by photolithographic technique at a position where an npn transistor is formed in later steps. Then, n type epitaxial layer 62 is grown, for example, approximately 1 to 2 microns thick on the entire semiconductor structure by an epitaxial growth method. Thereafter, element forming regions are separated, by means of, for example, a PN junction, a selective oxidation, a buried oxidation, or a trench oxidation. This embodiment utilizes a buried oxide film. In other words, buried oxide film 63 is grown by a thermal oxidation method in a region except the element forming region of substrate 60 and in epitaxial layer 62, to separate an element forming region from other element forming regions and to separate base and emitter region 62A from collector electrode leading region 62B. Further, a photoresist film of a predetermined pattern is formed by photolithographic technique and an n type impurity is implanted in separated collector electrode leading region 62B by impurity implanting technique, using the photoresist film as a mask, so that a collector parasitic resistance is reduced. The impurity implanting is executed by a thermal diffusion or an ion implanting of the impurity before separating the element forming regions, or by a thermal diffusion or an ion implantation of the impurity after separating the element forming regions. Thereafter, a native silicon oxide film (not shown) on the structure is removed to expose base and emitter region 62A made of epitaxial layer 62 and collector electrode leading region 62B, and silicon oxide film (SiO₂ film) 64 is grown, for example, approximately 500 Angstroms thick by a thermal oxidation method.

PROCESS 2 (FIG. 9B)

As shown in FIG. 9B, silicon nitride film (SiN film) 65 is then grown, for example, approximately 1000 Angstroms thick by a pressure-reduced chemical vapor deposition method. Further, silicon oxide film 66 is grown on silicon nitride film 65, for example, approximately 5000 Angstroms thick by a pressure-reduced chemical vapor deposition method, and silicon nitride film 67 is then grown, for example, approximately 1500 Angstroms. Silicon nitride films 65, 67 and silicon oxide film 66 may be formed by a chemical vapor deposition method by utilizing plasma.

PROCESS 3 (FIG. 9C)

Then, photoresist film (not shown) is formed on the structure, the photoresist film is then patterned by photolithographic technique. Using, the patterned photoresist film as a mask, silicon nitride film 67, silicon oxide film 66 and silicon nitride film 65 are sequentially etched by a reactive ion etching method using gas such as CF₄ to obtain the structure in FIG. 9C. The etching is executed until the surface of epitaxial layer 62 is exposed. This step forms the laminated structures made of silicon nitride film 65, silicon oxide film 66 and silicon nitride film 67 on a part of base and emitter region 62A and collector electrode leading region 62B. The part of base and emitter region 62A forms an active base region.

PROCESS 4 (FIG. 9D)

Subsequently, as shown in FIG. 9D, silicon oxide film 68 is grown, for example, approximately 500 Angstroms thick by a thermal oxidation method on exposed base and emitter region 62A, and silicon nitride film 69, polycrystalline silicon film 70 and silicon oxide film 71 are sequentially grown on the structure by a pressure-reduced chemical vapor deposition method. Instead of the pressure-reduced chemical vapor deposition method, a chemical vapor deposition method by utilizing a plasma may be used.

PROCESS 5 (FIG. 9E)

When silicon oxide film 71 is then anisotropically etched, for example, by a reactive ion etching method using gas such as CF₄, silicon oxide film 71 remains only on the side wall of a laminated structure made of silicon nitride film 65, silicon oxide film 66 and silicon nitride film 67. Using the remaining silicon oxide film 71 as a mask, the primary polycrystalline silicon film 70 is etched by a reactive ion etching method by using gas such as Cl₂ to obtain the structure as shown in FIG. 9E.

PROCESS 6 (FIG. 9F)

Then, the remaining silicon oxide film 71 is removed by fluoric acid solution. Thereafter, the polycrystalline silicon film 70 exposed by the removal of silicon oxide film 71 is oxidized by a thermal oxidation method to be converted to silicon oxide film 72. Using the silicon oxide film 72 as a mask, silicon nitride film 69 is etched by, for example, a dry etching method using a gas plasma such as CF₄ to obtain the structure as shown in FIG. 9F.

PROCESS 7 (FIG. 9G)

Silicon oxide film 72 is then removed by fluoric acid solution. Then, using the exposed silicon nitride film 69 as a mask, the structure is thermally heated so that silicon oxide film 73 as a buried oxide film is grown in base and emitter region 62A. Silicon oxide film 73 is continued to buried oxide film 63 formed in advance, and the effective area of base and emitter region 62A made of epitaxial layer is reduced as compared with that in the steps before silicon oxide film 73 is formed. By the provision of silicon oxide film 73, the position of external base region formed in later steps is determined approximately by 0.1 micron unit outside the laminated structure made of silicon nitride film 65, silicon oxide film 66 and silicon nitride film 67. Thereafter, silicon nitride films 67, 69 are etched by a dry etching method using gas plasma such as CF₄ to obtain the structure as shown in FIG. 9G.

PROCESS 8 (FIG. 9H)

Then, silicon oxide film 68 is etched by fluoric acid solution base electrode leading polycrystalline silicon film 74 is grown on the structure, and the film is coated with a photoresist 75 of an organic material in a predetermined thickness. As shown in FIG. 9H, the thickness of photoreeist film 75 is reduced on silicon oxide film 66.

PROCESS 9 (FIG. 9I)

Thereafter, when photoresist 75 and polycrystalline silicon film 74 are etched by a reactive ion etching method using gas such as Cl₂, polycrystalline silicon film 74 on silicon oxide film 66 on which the thickness of photoresist film 75 is reduced is etched and removed, though the portion of polycrystalline silicon film 74 on which a thick portion of photoresist film 75 exists still remains. Thereafter, when the remaining photoresist 75 is removed, &hs structure as shown in FIG. 9I is obtained. Since the completion of the etching is detected by the exposure of the surface of silicon oxide film 66, the completion can be readily recognized. A p type impurity such as boron is implanted by an ion implanting method to remaining polycrystalline silicon film 74. Instead, a P type impurity may be doped into polycrystalline silicon film 74 When the film is grown.

PROCESS 10 (FIG. 9J)

Figure 9J:
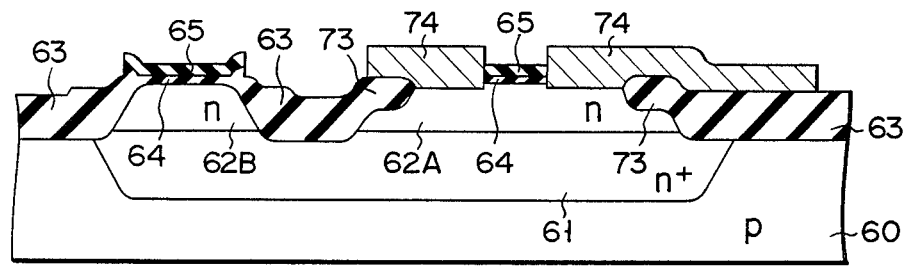

After silicon oxide film 66 is then etched with fluoric acid solution, a photoresist film of a predetermined pattern (not shown) is formed to cover the region which contains base and emitter region 62A. Using the photoresist film as a mask, polycrystalline silicon film 74 is selectively etched to obtain the structure as shown in FIG. 9J.

PROCESS 11 (FIG. 9K)

Figure 9K:
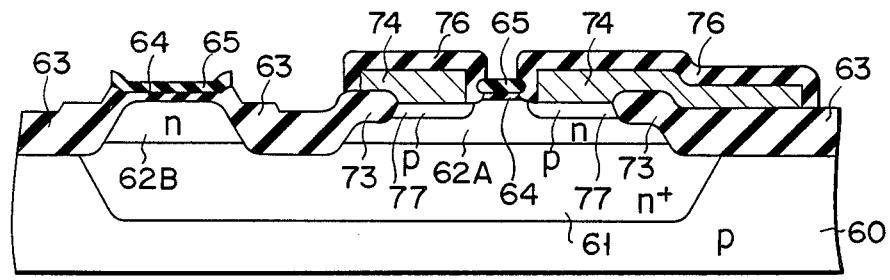

Polycrystalline silicon film 74 is then oxidized by a thermal oxidation method to form silicon oxide film 76 on the surface region of the film 74. Simultaneously, p type impurity doped in advance to polycrystalline silicon film 74 is diffused into base and emitter region 62A, so that p type external base region 77 is formed in base and emitter region 62A as shown in FIG. 9K.

PROCESS 12 (FIG. 9L)

Figure 9L:
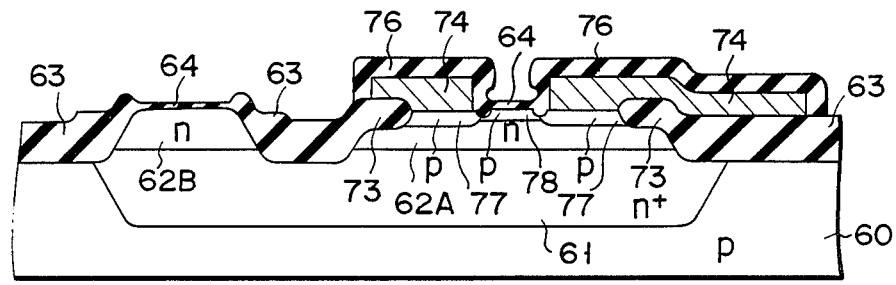

As shown in FIG. 9L, silicon nitride film 65 is then removed by a dry etching method using gas such as CF4, a p type impurity is doped into the center portion of in base and emitter region 62A by an ion implanting method to form internal base region 78.

PROCESS 13 (FIG. 9M)

Silicon oxide films 64 on internal base region 78 and collector electrode leading region 62B are then etched by a reactive ion etching method using fluoric acid solution or gas such as CF4 to expose the regions 78 and 62B. Then, polycrystalline silicon film 79 to which no impurity is doped is grown on the semiconductor structure by a pressure-reduced chemical vapor deposition method. Thereafter, an n type impurity such as arsenic is doped to polycrystalline silicon film 79 by an ion implanting method. Polycrystalline silicon film 79 is then patterned by photolithographic technique so that those portions of the film 79 on internal base region 78 and collector electrode leading region 62B are remained. Then, a thermal diffusion of the impurity doped into the film 79 is performed to form n type emitter region 80 in internal base region 78. Emitter region 80 may be formed by forming polycrystalline silicon film which is doped with an impurity by a pressure-reduced chemical vapor depoeition method and by thermally heating the film to diffuse the impurity doped in the film into internal base region 78 so that emitter region 80 is formed. Alternatively, emitter region 80 may be formed by directly doping an impurity into internal base region 78 by an ion implantation method.

Insulating film 81 is grown on the structure, and contacting holes are then formed in insulating film 81 at predetermined positions. Thereafter, metal layer made of, for example, aluminum is formed on the structure by a sputtering method, and the metal layer is patterned to form collector electrode 82, emitter electrode 88, base electrode 84, thereby finishing an npn transistor.

As described above, in the manufacturing method of the semiconductor device according to the embodiment of FIGS. 9A to 9M, when dry etching is performed, using chlorine gas plasma which damages a single crystal silicon layer, silicon nitride film 65 is retained on the active region (internal base region 78) where emitter region 80 is formed in later step. Thus, the surface of the active region is not exposed with chlorine plasma atmosphere, so that the surface of the active region is not damaged. Therefore, the size of the transistor can be reduced by utilizing high etching accuracy of anisotropically dry etching technique.

As shown in FIG. 9K, base leading electrode made of polycrystalline silicon film 74 and emitter region 80 formed in the step of FIG. 9M are separated by silicon oxide film 76 formed by oxidizing the polycrystalline silicon film 74 adjacent to the side wall of silicon nitride film 65. Therefore, polycrystalline silicon film 74 and emitter electrode 8 are separated in the minimum size of the thickness of silicon oxide film 7 in a self-alignment manner.

Further, in the step in FIG. 9G, using silicon oxide film 69 (FIG. 9F) as a mask, the selective oxidation is performed so that silicon oxide film 78 is grown in base and emitter region 62A. Thus, the effective area of base and emitter region 62A is reduced, and the area of the entire base region made of external base region 77 and internal base region 78 formed in later steps is accordingly decreased. Therefore, base resistance rbb' can be sufficiently reduced, collector-base junction capacity Cjc can be also sufficiently reduced.

Since the manufacturing methods according to the embodiments have no special step, production yield can be improved and high mass productivity can be obtained.

In the embodiments described above, the base leading electrode is composed of polycrystalline silicon film 74. This may be composed of a structure which is generally called "polyside", i.e., 2-layer structure of the film formed of a lower layer of polycrystalline silicon film and an upper layer of the film of silicon and a compound of high melting point metal such as molybdenum, titanium or tungsten. Polycrystalline silicon film 74 is used in the embodiment as an example of non-single crystal silicon. Non-single crystal silicon layer includes a layer made of a amorphous silicon.

FIGS. 10A and 10B are sectional views showing semiconductor structures of still another embodiments of the method of the invention. In the embodiment of in FIGS. 9A to 9M, polycrystalline silicon film 70 (FIG. 9E) is formed on the entire silicon nitride film 69 so that silicon nitride film 69 is remained on the side wall of the laminated structure made of silicon nitride film 65, silicon oxide film 66 and silicon nitride film 67. However, in the method of the embodiment of FIGS. 10A and 10B, after the step of FIG. 9C is finished, silicon oxide film 68 is grown, and silicon nitride film 69 and silicon oxide film 71 are sequentially grown as shown in FIG. 10A. Thereafter, silicon oxide film 71 and silicon nitride film 69 are etched by anisotropically etching method to obtain the structure as shown in FIG. 10B. Thereafter, the remaining silicon oxide film 71 is removed. Using silicon nitride film 69 exposed by this removal of the film 71 as a mask, silicon oxide film 72 (FIG. 5G) is formed by selective oxidation. According to this method, the steps can be shortened as compared with the embodiment of the case of the method in FIGS. 9A to 9M.

According to the present invention as described above, there is provided a method for manufacturing a semiconductor device in which the damage of the active region by anisotropically etching method can be prevented, the base resistance can be sufficiently reduced, the production yield is increased and high mass productivity is provided.

What is claimed is:

1. A method of manufacturing a semiconductor device comprising the steps of:
   forming on a first conductivity type semiconductor substrate, a first insulating layer comprising a first oxidation resistant insulating film, a second insulating film formed on said first oxidation resistant insulating film and having a selectivity of an etching condition to said first insulating film, and a third oxidation resistant insulating film formed on said second insulating layer,
   forming a fourth oxidation resistant insulating film on the structure having said first insulating layer,
   selectively etching said fourth insulating film so that part of the fourth insulating film remains on the side wall of said first insulating layer,
   selectively oxidizing the surface of the semiconductor substrate using the remaining fourth insulating film as a mask to form an oxide layer on the semiconductor substrate,
   removing the remaining fourth and third insulating films, exposing the surface of said semiconductor region between said first insulating layer and said buried oxide layer, forming a first non-single crystal semiconductor film on the structure having said first insulating layer, selectively removing said first non-single crystal semiconductor film on said second insulating film, doping a second conductivity type impurity to said first non-single crystal semiconductor film, removing said second insulating film, thermally heating the surface of said first non-single crystal semiconductor film to form a thermal oxide film and to diffuse the impurity in said first non-single crystal semiconductor film into said semiconductor region to form a second conductivity type first semiconductor layer, removing said first insulating film, doping the second conductivity type impurity into the surface of said semiconductor region adjacent to the first semiconductor layer, using said thermal oxide film as a mask, to form a second semiconductor layer, and forming a first conductivity type third semiconductor layer on the surface of said second semiconductor layer.

2. The method according to claim 1, wherein said step for selectively etching said fourth insulating film comprises:

forming a second non-signal crystal semiconductor film on said fourth insulating film and a fifth insulating film on said second non-single crystal semiconductor film, having an etching condition which has a selectivity to said fourth insulating film and, then, selectively etching the fifth insulating film by an anisotropically etching method so that the part thereof only on the side wall of said first insulating layer remains, selectively etching said second non-single crystal semiconductor film using the remaining fifth insulating film as a mask so that the part thereof only on the side wall of said first insulating layer remains, thermally oxidizing the remaining second non-single crystal semiconductor film to form a thermal oxide film, and etching said fourth insulating film by an etching method, using said thermal oxide film as a mask.

3. The method according to claim 1, wherein said step for selectively etching said fourth insulating film comprises:

forming on said fourth insulating film, a fifth insulating film having a selectivity of etching condition to said fourth insulating film and, then, etching said fifth insulating film by an anisotropically etching method.

4. The method according to claim 1, wherein said step of selectively removing said first non-single crystal semiconductor film comprises:

coating the entire surface of said first non-single crystal semiconductor with an organic compound to form an organic layer, and etching the layer by an anisotropically etching method.

5. The method according to claim 1, wherein an impurity of said second conductivity type is doped into said first non-single crystal semiconductor film, when the first non-single crystal semiconductor film is formed.

6. The method according to claim 1, wherein said first non-single crystal semiconductor film is formed of a polyside film.

* * * * *